(12) United States Patent
Yuh

(10) Patent No.: US 8,110,844 B2
(45) Date of Patent: Feb. 7, 2012

(54) SEMICONDUCTOR SUBSTRATE AND LIGHT EMITTING DEVICE USING THE SAME

(75) Inventor: Hwan-Kuk Yuh, Gyeonggi-do (KR)

(73) Assignee: Theleds Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/023,662

(22) Filed: Feb. 9, 2011

(65) Prior Publication Data

US 2011/0193122 A1 Aug. 11, 2011

(30) Foreign Application Priority Data

Feb. 10, 2010 (KR) .................. 10-2010-0012279

(51) Int. Cl.
*H01L 33/12* (2010.01)
(52) U.S. Cl. ............ 257/98; 257/E33.073; 257/E33.064
(58) Field of Classification Search .............. 257/98, 257/E33.073, E33.064
See application file for complete search history.

(56) References Cited

U.S. PATENT DOCUMENTS

| 7,825,577 B2 * | 11/2010 | Hsu et al. ............... 313/498 |
| 2009/0166649 A1 * | 7/2009 | Lee ........................ 257/94 |
| 2011/0012109 A1 * | 1/2011 | Kryliouk et al. ......... 257/49 |
| 2011/0095327 A1 * | 4/2011 | Shinohara et al. ....... 257/98 |
| 2011/0233582 A1 * | 9/2011 | Cheng et al. ............ 257/98 |

FOREIGN PATENT DOCUMENTS

| KR | 1020040019352 A | 3/2004 |
| KR | 10-0580751 B1 | 5/2006 |
| KR | 10-0714639 B1 | 5/2007 |
| KR | 2007-0104715 A | 10/2007 |
| KR | 10-0924455 B1 | 11/2009 |
| KR | 2010-0008513 A | 1/2010 |

* cited by examiner

*Primary Examiner* — Trung Q Dang
(74) *Attorney, Agent, or Firm* — Hershkovitz & Associates, LLC; Abraham Hershkovitz

(57) ABSTRACT

There are provided a semiconductor substrate configured to improve the light extraction efficiency of a light emitting device, and a light emitting device using the substrate. The light emitting device includes the substrate, a buffer layer, and a light emitting structure, and the buffer layer and the light emitting structure being sequentially stacked on the substrate. The substrate includes a plurality of lenses disposed on a top surface thereof, and the lenses have a horn shape and are configured such that the buffer layer grows both on the top surface of the substrate and lateral surfaces of the lenses.

13 Claims, 9 Drawing Sheets

CORNIC

HEMISPHERIC

CYLINDRICAL

SEMICONDUCTOR SUBSTRATE AND LIGHT EMITTING DEVICE USING THE SAME

CROSS-REFERENCE TO RELATED APPLICATION

This application claims priority to Korean Patent Application No. 2010-0012279 filed on Feb. 10, 2010 and all the benefits accruing therefrom under 35 U.S.C. §119, the contents of which are incorporated by reference in their entirety.

BACKGROUND

The present disclosure relates to a light emitting device, and more particularly, to a substrate configured to improve light extraction efficiency of a light emitting device, and a light emitting device using the substrate.

The market of light emitting diodes (LEDs) has grown based on low-power LEDs used for keypads of portable communication devices such as cellular phones or small home appliances, and back light units of liquid crystal displays (LCDs). High-power, high-efficiency optical sources are recently required in the fields of interior lighting, exterior lighting, automobile interior or exterior lamps, back light units of large LCDs, etc., and thus the market of LEDs is now also concentrated on high-power products.

LEDs have a low light emitting efficiency. Generally, light emitting efficiency is determined by light generating efficiency (internal quantum efficiency), efficiency of guiding light outwardly (light extraction efficiency), and light conversion efficiency of a fluorescent material. Increasing the internal quantum efficiency by improving the characteristics of an active layer is effective to increase the output power of an LED; however, increasing the light extraction efficiency is more effective to increase the output power of an LED.

The biggest obstacle in guiding light to the outside of an LED may be internal total reflection caused by different refractive indexes of layers of the LED. Generally, due to different refractive indexes of layers of an LED, only about 20% of generated light can exit the LED. The rest of generated light is confined in the LED and is converted into heat as it moves in the LED. This results in a low light emitting efficiency and reduces the lifespan of the LED due to generation of heat.

Examples of light extraction efficiency increasing methods include a method of increasing the surface roughness of p-GaN or n-GaN, and a method of forming a rough or corrugated surface on a substrate which is a base of a light emitting device.

FIG. 1 is a sectional view illustrating a gallium nitride (GaN) LED 10 of the related art, and FIG. 2 is a perspective view illustrating a sapphire substrate 11. The GaN LED 10 includes the sapphire substrate 11 and a GaN light emitting structure 15 formed on the sapphire substrate 11.

The GaN light emitting structure 15 includes an n-type GaN cladding layer 15a, a multi-quantum well (MQW) active layer 15b, and a p-type GaN cladding layer 15c that are formed on the sapphire substrate 11. The GaN light emitting structure 15 may be grown by a process such as metal-organic chemical vapor deposition (MOCVD). Predetermined parts of the p-type GaN cladding layer 15c and the active layer 15b may be dry-etched to expose a topside part of the n-type GaN cladding layer 15a, and an n-type contact electrode 19 and a p-type contact electrode 17 may be formed on the exposed topside of the n-type GaN cladding layer 15a and the topside of the p-type GaN cladding layer 15c, respectively, so as to apply a voltage to the GaN LED 10. Generally, a transparent electrode 16 is formed on the topside of the p-type GaN cladding layer 15c before the p-type contact electrode 17 is formed, so as to increase a current injection area without reducing brightness.

The sapphire substrate 11 includes lenses 12 to improve light extraction efficiency. The lenses 12 used for the GaN LED 10 of the related art are generally hemisphere-shaped as shown in FIG. 2. Optimization of the shape and arrangement density of the lenses 12 is necessary to improve light extraction efficiency and characteristics of the GaN light emitting structure 15.

SUMMARY

The present disclosure provides a semiconductor substrate including lenses arranged more densely to improve light extraction efficiency and configured such that a light emitting structure having good characteristics can be formed on the substrate, and a light emitting device using the semiconductor substrate.

According to an exemplary embodiment, there is provided a substrate for a light emitting device including the substrate, a buffer layer, and a light emitting structure, the buffer layer and the light emitting structure being sequentially stacked on the substrate, the substrate including a plurality of lenses disposed on a top surface thereof, wherein the lenses have a horn shape and are configured such that the buffer layer grows both on the top surface of the substrate and lateral surfaces of the lenses.

According to another exemplary embodiment, there is provided a light emitting device including: a substrate comprising a plurality of lenses; a buffer layer disposed on the substrate; and a light emitting structure disposed on the buffer layer, wherein the lenses have a horn shape and are configured such that the buffer layer grows both on a top surface of the substrate and lateral surfaces of the lenses.

A part of the buffer layer growing on the top surface of the substrate may have the same crystal orientation as that of parts of the buffer layer growing on the lateral surfaces of the lenses An angle between lateral and bottom surfaces of the lenses may be greater than 30° but smaller than 57.6°, and the lenses may have a height equal to or greater than 1.6 μm and are arranged at intervals of 1 μm or smaller.

The buffer layer may be formed of a nitride semiconductor such as AlN (aluminum nitride), and the buffer layer may have a thickness of 100 nm or greater.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, a semiconductor substrate and a light emitting device using the semiconductor substrate will be described with reference to the accompanying drawings according to exemplary embodiments. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
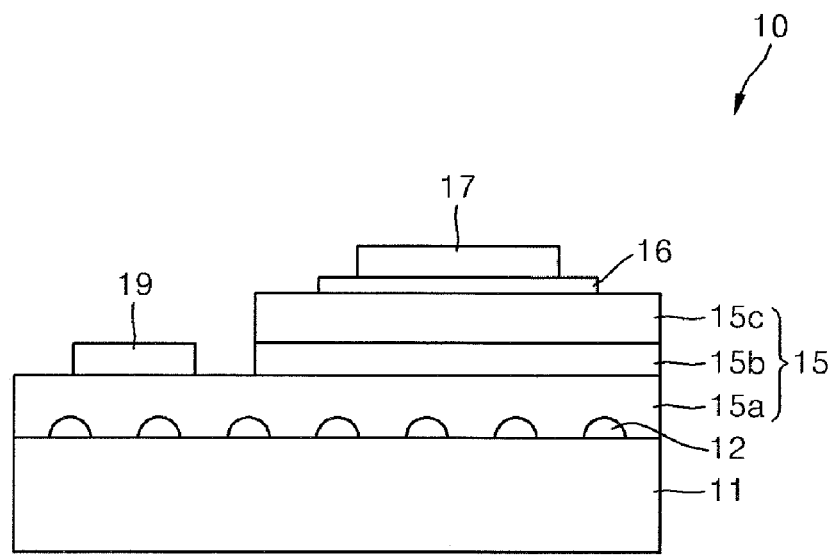
FIG. 1 is a schematic sectional view illustrating a GaN light emitting diode of the related art.
Figure 2:
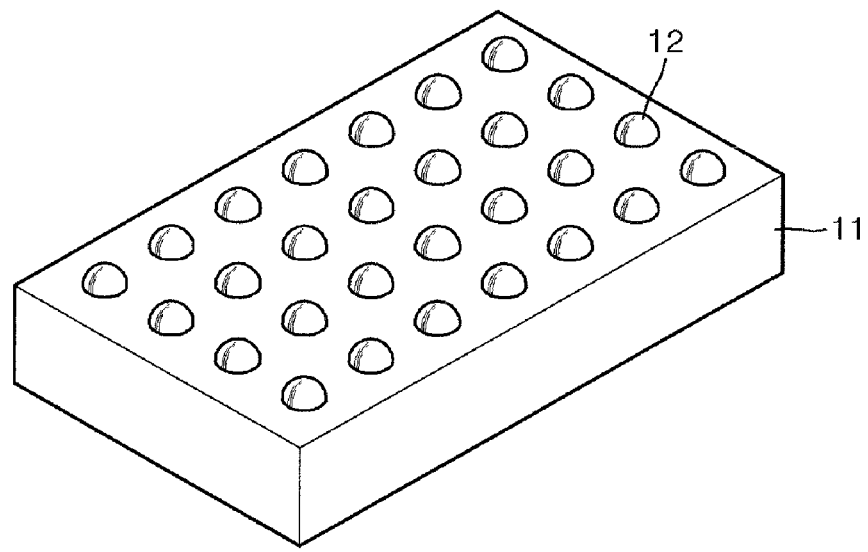
FIG. 2 is a schematic perspective view illustrating a substrate of the related-art GaN light emitting diode illustrated FIG. 1.
Figure 3A:
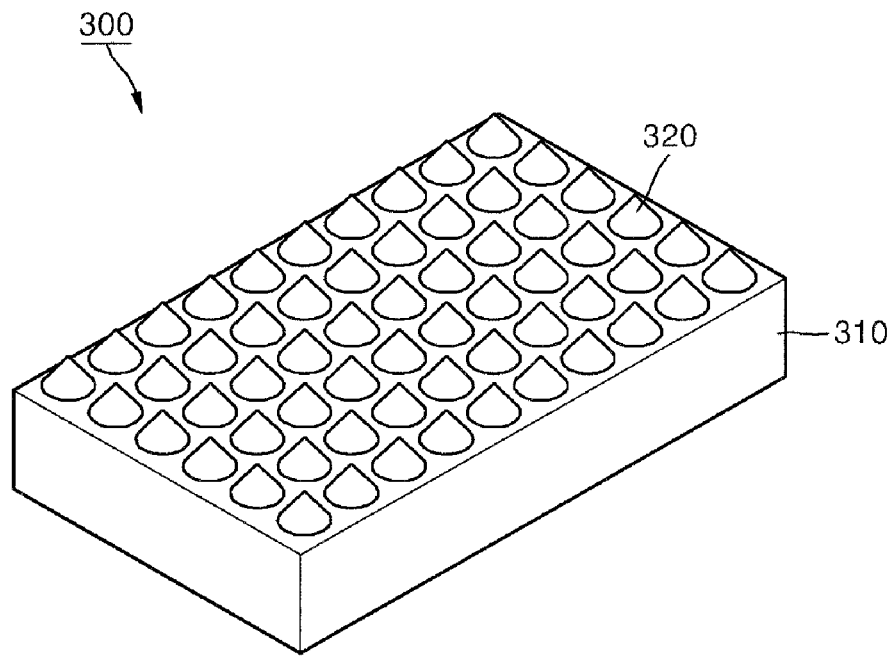
FIGS. 3A and 3B are a schematic perspective view and a schematic section view illustrating a light emitting device substrate according to an exemplary embodiment.
Figure 3B:
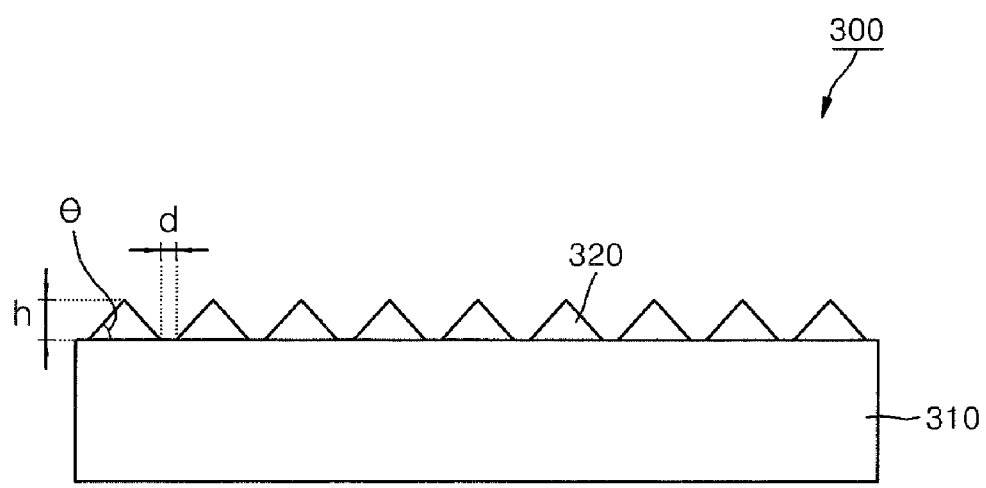

FIGS. 3A and 3B are a schematic perspective view and a schematic section view illustrating a light emitting device substrate according to an exemplary embodiment;

Referring to FIGS. 3A and 3B, the light emitting device substrate 300 of the current embodiment includes a base substrate 310 and a plurality of lenses 320. A buffer layer and a light emitting structure may be sequentially stacked on the light emitting device substrate 300 to form a light emitting device.

The kind of the base substrate 310 is not limited. For example, a sapphire substrate may be used as the base substrate 310. In the case where a light emitting device is fabricated by using a gallium-nitride (GaN) compound semiconductor, a sapphire substrate may be used as the base substrate 310.

Figure 4:
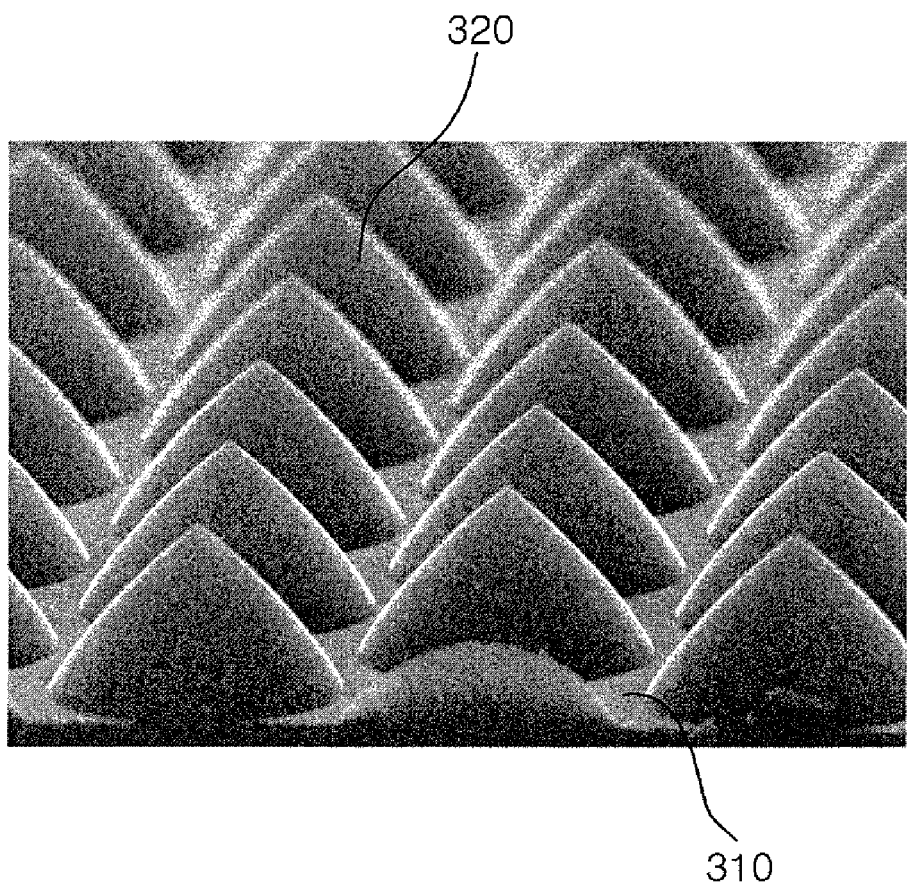
FIG. 4 is a scanning electron microscope (SEM) image illustrating a light emitting device substrate according to an embodiment.

The lenses 320 are disposed on the top surface of the base substrate 310. The lenses 320 are spaced from each other as individual lenses and have a horn shape. The lenses 320 and the base substrate 310 may be formed in one piece by etching the base substrate 310, or the lenses 320 may be formed of a separate material. FIG. 4 is a scanning electron microscope (SEM) image illustrating a light emitting device substrate including a sapphire substrate 310 and conic lenses 320 formed on the top surface of the sapphire substrate 310 by etching the sapphire substrate 310. As shown in FIG. 4, by etching the sapphire substrate 310, the conic lenses 320 can be formed in a manner such that the conic lenses 320 have uniform sizes and are uniformly arranged.

Figure 5:
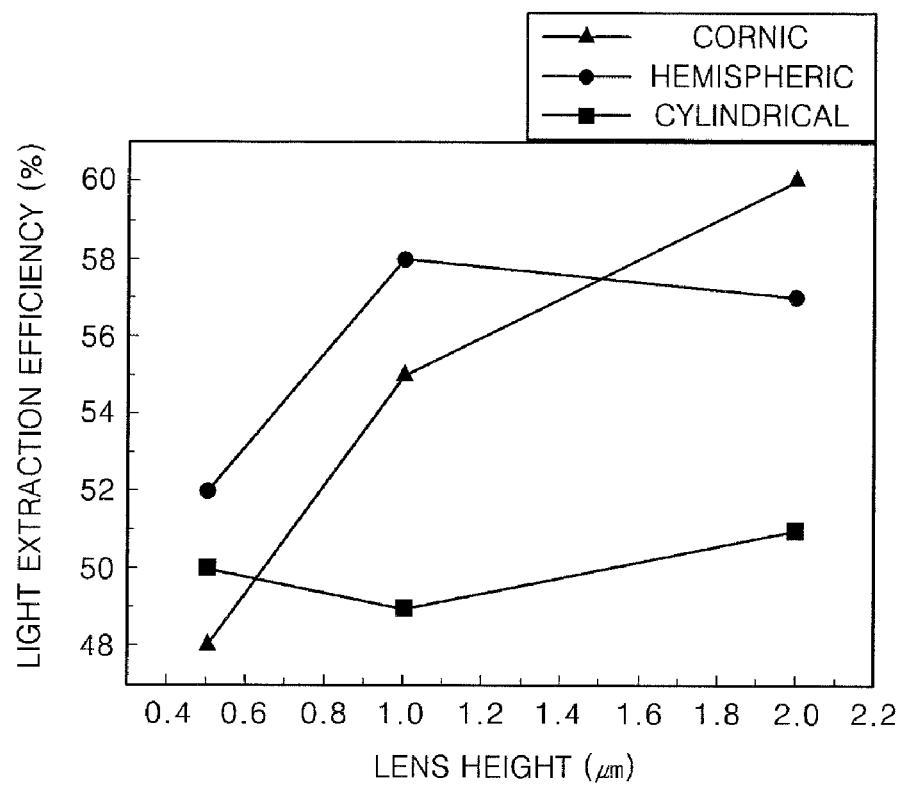
FIG. 5 is a graph illustrating light extraction efficiency according to shapes of lenses disposed on a substrate.
Figure 5:
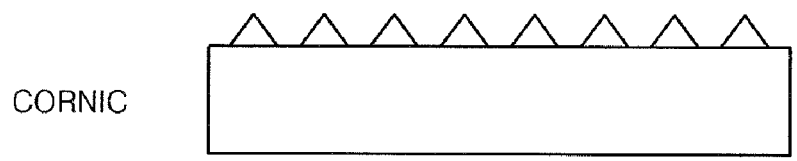
Figure 5:
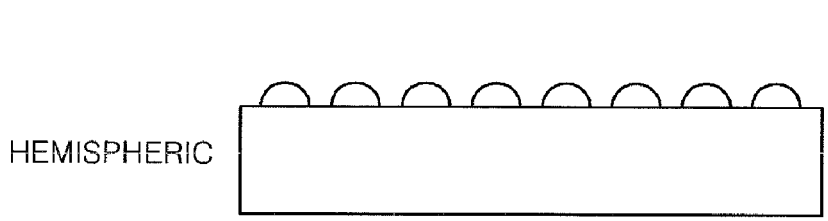
Figure 5:
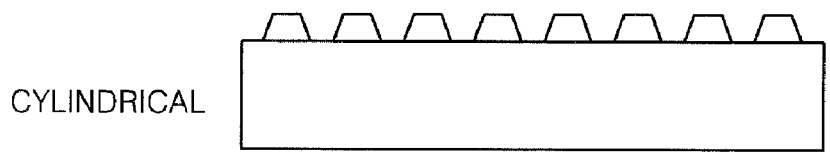

The height (h) of the lenses 320 may be 1.6 µm or greater. FIG. 5 shows light extraction efficiency with respect to lens height for different shapes of lenses.

In FIG. 5, CONIC denotes a conic lens, and HEMISPHERIC denotes a hemispheric lens. In addition, CYLINDRICAL denotes a cylindrical lens having a flat circular topside and a flat circular bottom side smaller than the flat circular topside. In any of the lenses of FIG. 5, a section taken in parallel with a bottom side is circular.

Referring to FIG. 5, in the case of the hemispheric lens (-●-), the light extraction efficiency increases in proportion to the height of the lens until the height of the lens reaches 1 µm. However, the light extraction efficiency does not vary largely after the height of the lens becomes equal to or greater than 1 µm. In the case of the cylindrical lens (-■-), the light extraction efficiency does not vary largely according to the height of the lens. However, in the case of the conic lens (-▲-), the light extraction efficiency increases as the height of the lens increases. As shown in FIG. 5, when the lens height is equal to or greater than about 1.6 µm, the light extraction efficiency is greater in the case of the conic lens (-▲-) than in the cases of the other lenses (-●-, -■-). Therefore, in the case of a conic lens, highest light extraction efficiency can be obtained by adjusting the height of the conic lens equal to or greater than about 1.6 µm. In this case, the light extraction efficiency can be equal to or greater than about 60%.

Thus, when the lenses 320 have a horn shape having an apex at its upper end, light extraction efficiency can be increased by increasing the height (h) of the lenses 320. In addition, when processes of forming conic lenses are considered, it is easy to form the lenses 320 if the lenses 320 have a large height (h). Furthermore, if a nitride semiconductor layer is epitaxially grown on the light emitting device substrate 300, the surface of the nitride semiconductor layer can be easily leveled.

In addition to the height of the lenses 320, the density of the lenses 320 affects light extraction efficiency. As the lenses 320 are densely formed, light extraction efficiency can be increased. In the current embodiment, to increase light extraction efficiency, the lenses 320 may be formed at intervals (d) of 1 µm or smaller. However, if the lenses 320 are densely formed, it is difficult to grow a nitride semiconductor layer on the light emitting device substrate 300. This is explained with reference to FIGS. 6 through 7B.

Figure 6:
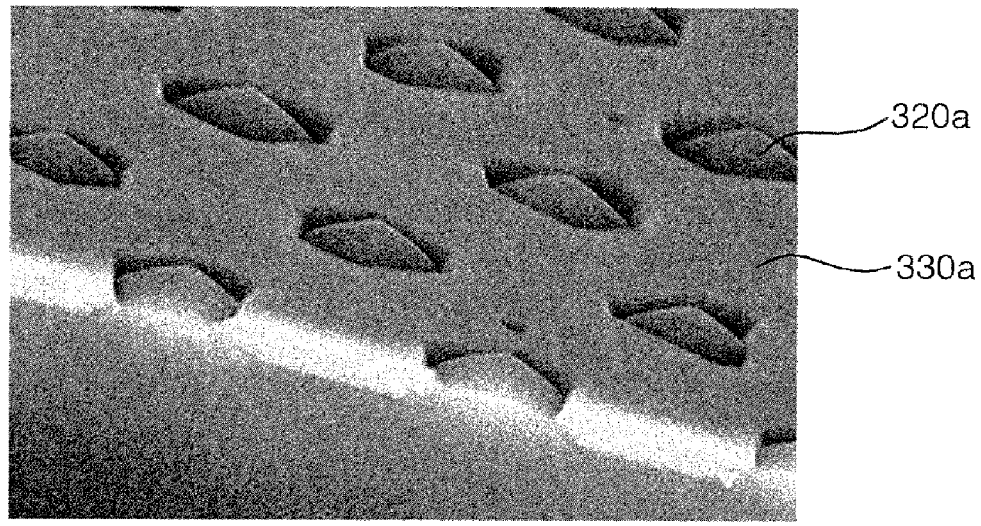
FIG. 6 is a SEM image illustrating a nitride semiconductor layer grown on a substrate in a low lens density condition.
Figure 7A:
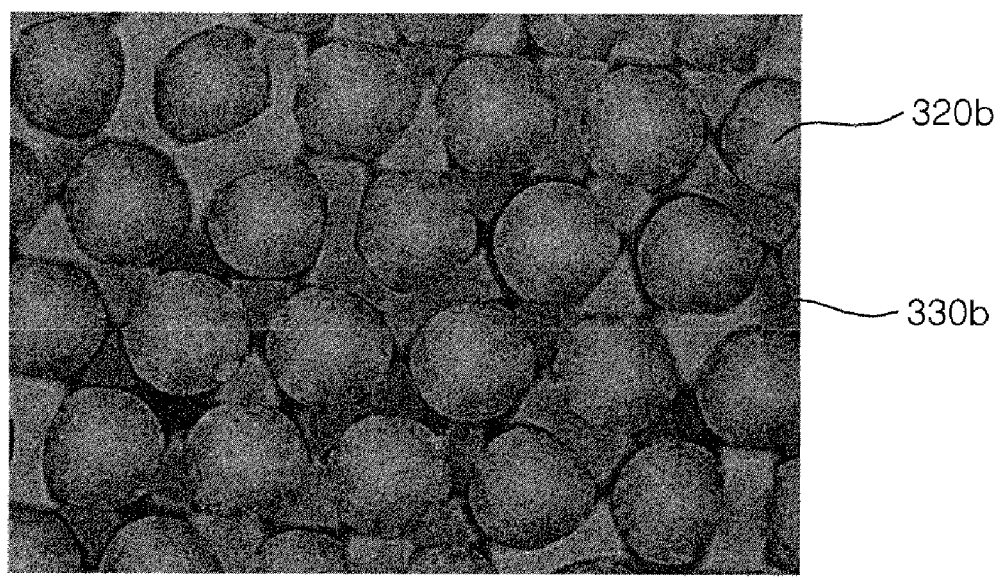
FIGS. 7A and 7B are SEM images illustrating a nitride semiconductor layer grown on a substrate in a high lens density condition by a method of the related art, FIG. 7A illustrating the surface of the nitride semiconductor layer in an early stage of growth of the nitride semiconductor layer, FIG. 7B illustrating the surface of the nitride semiconductor layer after the growth of the nitride semiconductor layer is completed.
Figure 7B:
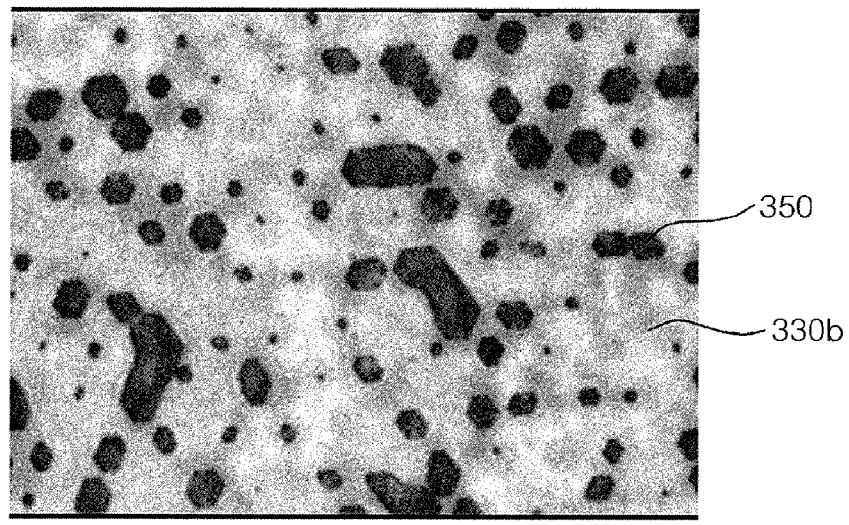

FIG. 6 is a SEM image illustrating a nitride semiconductor layer 330a grown on a substrate in a low lens density condition. FIGS. 7A and 7B are SEM images illustrating a nitride semiconductor layer 330b grown on a substrate in a high lens density condition by a method of the related art, FIG. 7A illustrating the surface of the nitride semiconductor layer 330b at an early stage of growth, FIG. 7B illustrating the surface of the nitride semiconductor layer 330b after the growth of the nitride semiconductor layer 330b is completed; FIG. 6 illustrates the case where lenses 320a are arranged at intervals of 1 µm or greater, and FIGS. 7A and 7B illustrate the case where lenses 320b are arranged at intervals smaller than 1 µm.

Referring to FIG. 6, when the lenses 320a are not densely arranged, the nitride semiconductor layer 330a is well grown and leveled on the substrate. However, referring to FIGS. 7A and 7B illustrating the case where the lenses 320b are densely arranged, the nitride semiconductor layer 330b is not evenly grown on the substrate. Particularly as shown in FIG. 7B, the nitride semiconductor layer 330b has discontinuous parts 350 even after the growth of the nitride semiconductor layer 330b is completed.

In the related art, if it is intended to grow a nitride semiconductor layer is grown on a substrate where lenses are formed, although the nitride semiconductor layer is grown on exposed parts of the top surface of the substrate, the nitride semiconductor layer is not grown on lateral surfaces of the lenses. Therefore, in the case where the exposed parts of the top surface of the substrate are wide because the lenses 320a are not densely arranged, as shown in FIG. 6, the nitride semiconductor layer 330a is grown like water filled between the lenses 320a, and then the lenses 320a is surrounded by the grown nitride semiconductor layer 330a. However, in the case where the exposed parts of the top surface of the substrate are narrow because the lenses 320b are densely arranged, growth of the nitride semiconductor layer 330b is hindered by the lenses 320b. That is, since the exposed parts of the top surface of the substrate are narrow, at an early stage of growth (refer to FIG. 7A), the nitride semiconductor layer 330b is epitaxially grown individually in narrow regions, and the individually grown parts of the nitride semiconductor layer 330b are not merged in a later stage due to the lenses 320b. Thus, although the nitride semiconductor layer 330b is further grown, the nitride semiconductor layer 330b is not leveled, and the discontinuous parts 350 are formed at the nitride semiconductor layer 330b.

That is, in the related art, if the density of lenses is increased to improve light extraction efficiency, the properties of a nitride semiconductor layer grown on a substrate are degraded, and thus the performance of a light emitting device is lowered. Thus, to improve light extraction efficiency while maintaining or improving the properties of a nitride semiconductor layer, it is necessary to grow a nitride semiconductor layer simultaneously on the top surface of a substrate and lateral surfaces of lenses. For this reason, in the current embodiment, the lenses 320 are formed in a manner such that the buffer layer can be grown on the top surface of the base substrate 310 and the lateral surfaces of the lenses 320. That is, if the buffer layer can be grown both on the top surface of the base substrate 310 and the lateral surfaces of the lenses 320, although the exposed parts of the top surface of the base substrate 310 are narrow because the lenses 320 are densely arranged, the buffer layer can be evenly formed. In addition, if a part of the buffer layer grown on the top surface of the base substrate 310 has the same crystal orientation as that of parts of the buffer layer grown on the lateral surfaces of the lenses 320, the parts of the buffer layer can merge with each other easily, and thus the buffer layer can have an even surface at the end of growth. Therefore, the lenses 320 may be formed in a manner such that a part of a buffer layer formed on the top surface of the base substrate 310 can have the same crystal orientation as that of parts of the buffer layer grown on the lateral surfaces of the lenses 320. For this end, the crystal orientation of the lateral surfaces of the lenses 320 may be considered. For example, the lenses 320 may be formed in a manner such that the angle (refer to θ in FIG. 3B) between lateral and bottom surfaces of the lenses 320 is greater than 30° but smaller than 57.6°. This will now be explained with reference to FIGS. 8 and 9. The explanation is given on an exemplary case where a gallium nitride buffer layer is formed on a sapphire substrate.

Figure 8:
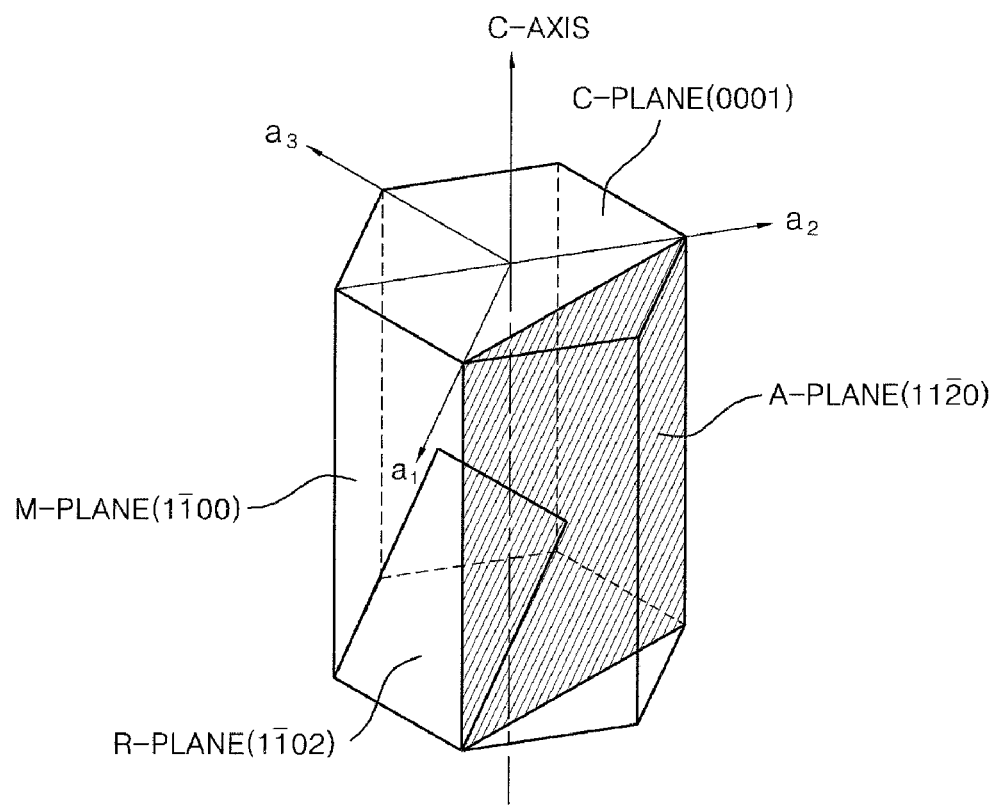
FIG. 8 is a schematic view illustrating a sapphire unit cell.
Figure 9:
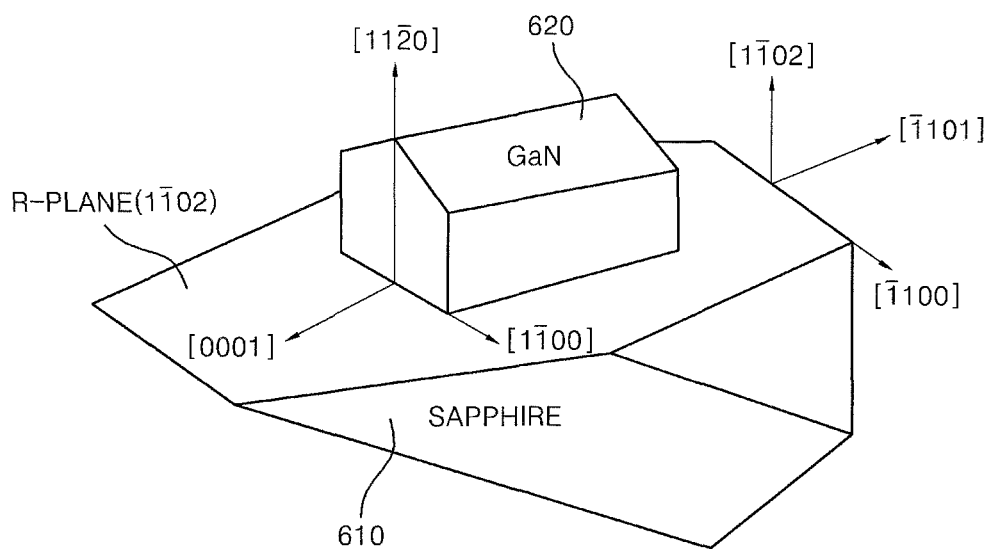
FIG. 9 is a view illustrating crystal orientations of gallium nitride (GaN) grown on an R-plane (1 $\bar{1}$ 02) of sapphire.

FIG. 8 is a schematic view illustrating a sapphire unit cell, and FIG. 9 is a view illustrating crystal orientations of gallium nitride (GaN) grown on an R-plane (1$\bar{1}$02) of sapphire.

As shown in FIG. 8, sapphire includes stable low index planes: a C-plane (0001) orthogonal to the C-axis; an R-plane (1$\bar{1}$02) inclined 57.6° from the C-plane; an M-plane (1$\bar{1}$00) orthogonal to the C-plane (0001); and an A-plane (11$\bar{2}$0) orthogonal to the C-plane. (0001) gallium nitride grows on the C-plane (0001) of a sapphire substrate 610 (refer to FIG. 9). However, gallium nitride having different crystal orientations is grown on the R-plane (1$\bar{1}$02), M-plane (1$\bar{1}$00), and A-plane (11$\bar{2}$0) of the sapphire substrate 610.

Figure 10A:
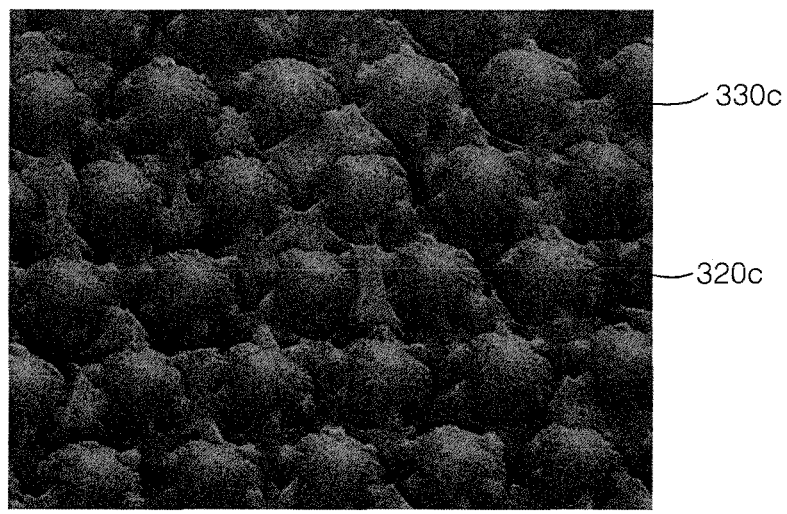
FIGS. 10A through 10C are SEM images illustrating a nitride semiconductor layer grown on a light emitting device substrate in a high lens density condition according to an exemplary embodiment, FIG. 10A illustrating the surface of the nitride semiconductor layer in an early stage of growth of the nitride semiconductor layer, FIG. 10B illustrating the surface of the nitride semiconductor layer in a middle stage of growth of the nitride semiconductor layer, FIG. 10C illustrating the surface of the nitride semiconductor layer after the growth of the nitride semiconductor layer is completed.
Figure 10B:
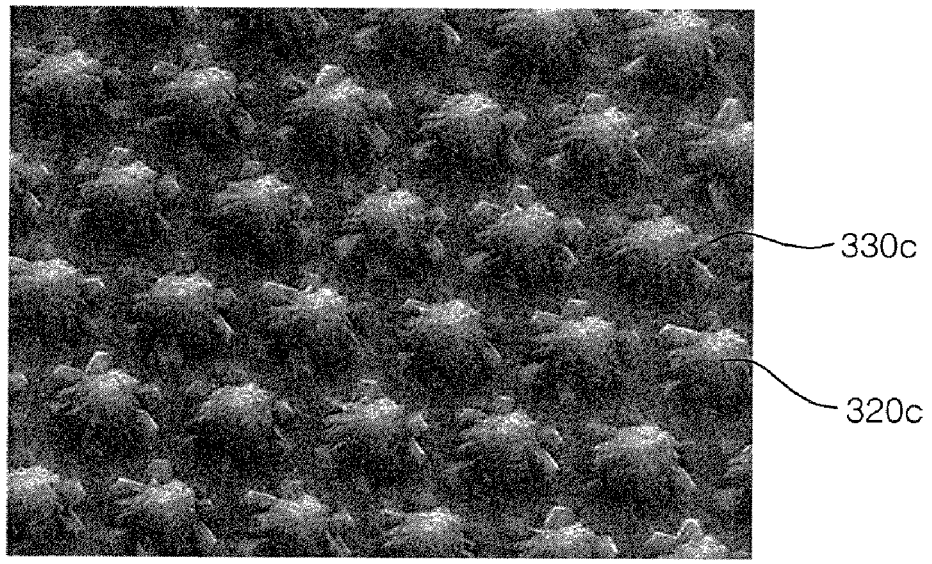
Figure 10C:
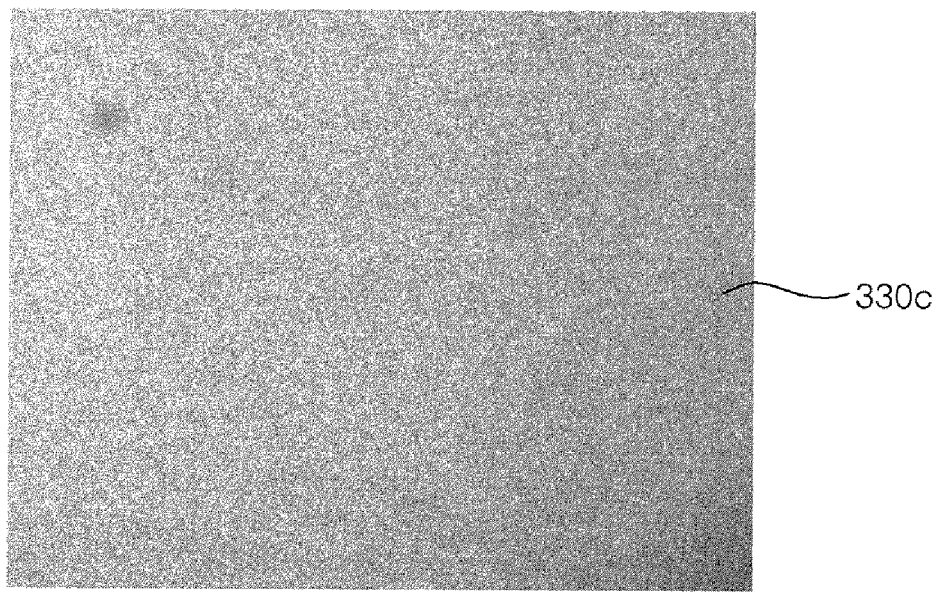

As shown in FIG. 9, (11$\bar{2}$0) gallium nitride 620 grows on the R-plane (1$\bar{1}$02) of the sapphire substrate 610. In addition, (11$\bar{2}$2) gallium nitride (not shown) grows on the M-plane (1$\bar{1}$00) and A-plane (11$\bar{2}$0) of the sapphire substrate 610. As described above, when the base substrate 310 is a C-plane (0001) sapphire substrate, if the lateral surfaces of the lenses 320 are R-planes (1$\bar{1}$02), M-planes (1$\bar{1}$00), or A-planes (11$\bar{2}$0), gallium nitride grown on the top surface of the base substrate 310 has a crystal orientation different from those of gallium nitride grown on the lateral surfaces of the lenses 320. As described above, if gallium nitride grown on the top surface of the base substrate 310 has a crystal orientation different from those of gallium nitride grown on the lateral surfaces of the lenses 320, the gallium nitrides may not merge with each other at a late stage of growth, and the growth of the gallium nitrides may stop. In other words, if the angle (refer to θ in FIG. 3B) between the lateral and bottom surfaces of the lenses 320 is about 57.6° or 90°, growth of a gallium nitride buffer layer is restricted. Therefore, to easily grow a buffer layer having an even surface, the angle (θ) between the lateral and bottom surfaces of the lenses 320 may not be about 57.6° and 90°. In addition, if the angle (θ) between the lateral and bottom surfaces of the lenses 320 is greater than 60° or smaller than 30°, light extraction efficiency is not high. In addition, in terms of process technology, it is difficult to make the angle (θ) between the lateral and bottom surfaces of the lenses 320 greater than 60°. Therefore, the lenses 320 may be formed in a manner such that the angle (θ) between the lateral and bottom surfaces of the lenses 320 is greater than 30° but smaller than 57.6°. FIGS. 10A through 10C illustrate a nitride semiconductor layer 330c formed on a substrate in a condition where the angle (θ) between the lateral and bottom surfaces of lenses 320c is greater than 30° but smaller than 57.6° and the distance between the lenses 320 is 1 μm or less.

In detail, FIGS. 10A through 10C are SEM images illustrating a nitride semiconductor layer 330c grown on a light emitting device substrate in a high lens density condition according to an embodiment. FIG. 10A illustrates the surface of the nitride semiconductor layer 330c in an early stage of growth of the nitride semiconductor layer, FIG. 10B illustrates the surface of the nitride semiconductor layer 330c in a middle stage of growth of the nitride semiconductor layer, and FIG. 10C illustrates the surface of the nitride semiconductor layer 330c after the growth of the nitride semiconductor layer is completed.

Referring to FIGS. 10A through 10C, although the lenses 320c are densely arranged at intervals of 1 μm or less, the nitride semiconductor layer 330c is evenly grown unlike the case shown in FIGS. 7A and 7B. This is possible since the nitride semiconductor layer 330c grows on the lateral surfaces of the lenses 320c as well as on the surface of the light emitting device substrate in the early stage of growth (FIG. 10A). In addition, a part of the nitride semiconductor layer 330c grown on the surface of the substrate has a crystal orientation similar to those of parts of the nitride semiconductor layer 330c grown on the lateral surfaces of the lenses 320c, the parts of the nitride semiconductor layer 330c can merge with each other easily, and thus the surface of the nitride semiconductor layer 330c can be even as shown in FIG. 10C.

Explanation has been given on the light emitting device substrate on which a nitride semiconductor layer can be evenly grown and by which light can be efficiently extracted from a light emitting device. Hereinafter, a light emitting device using the substrate will be described.

Figure 11:
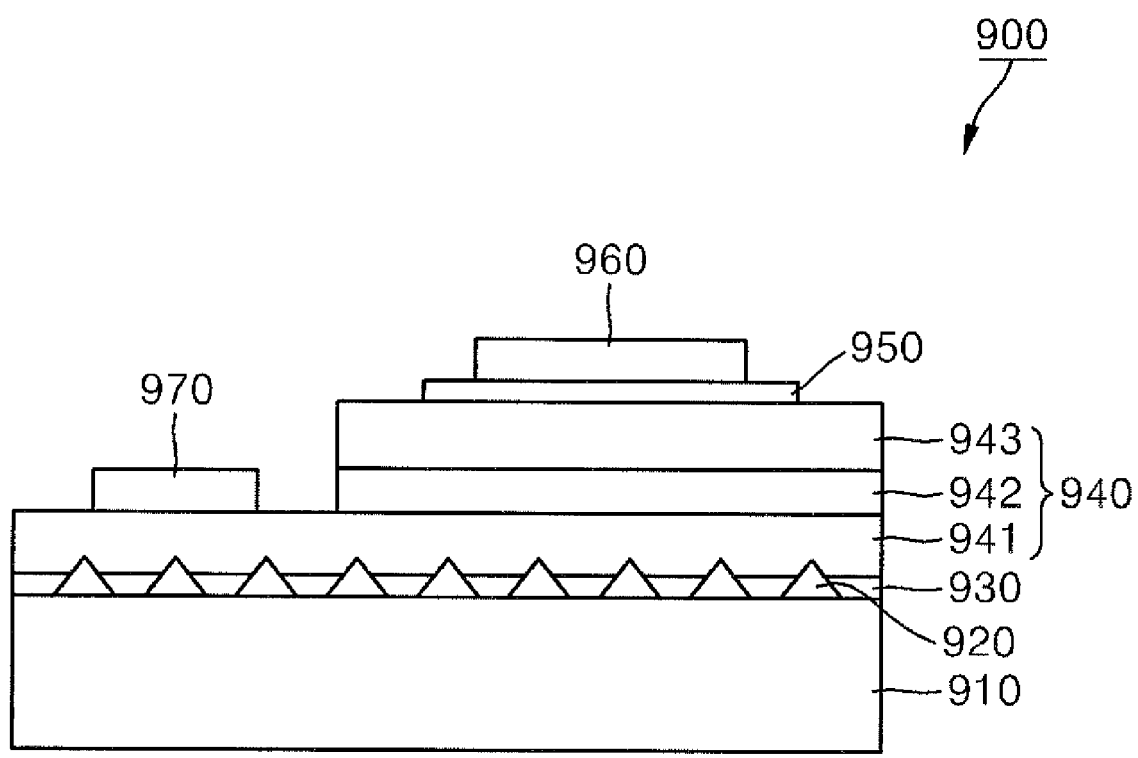
FIG. 11 is a schematic view illustrating a light emitting device according to an exemplary embodiment.

FIG. 11 is a schematic view illustrating a light emitting device 900 according to an exemplary embodiment.

Referring to FIG. 11, the light emitting device 900 of the current embodiment includes a base substrate 910, a plurality of lenses 920, a buffer layer 930, a light emitting structure 940, a transparent electrode 950, a p-type contact electrode 960, and an n-type contact electrode 970.

The kind of the base substrate 910 is not limited. For example, a sapphire substrate may be used as the base substrate 910. Particularly when the light emitting device 900 is fabricated by using a gallium-nitride (GaN) compound semiconductor, a sapphire substrate may be used as the base substrate 910.

The lenses 920 are disposed on the top surface of the base substrate 910. The lenses 920 are spaced from each other as individual lenses and have a horn shape so that light extraction efficiency can be improved. The lenses 920 and the base substrate 910 may be formed in one piece by etching the base substrate 910, or the lenses 920 may be formed of a separate material. As described above, to improve light extraction efficiency, the lenses 920 is formed in a manner such that the height of the lenses 920 is 1.6 µm or greater and the distance between the lenses 920 is 1 µm or smaller. In addition, the lenses 920 are shaped such that the buffer layer 930 can be evenly formed on the base substrate 910 although the lenses 920 are densely arranged. That is, the lenses 920 are shaped such that the buffer layer 930 can be grown simultaneously on the top surface of the base substrate 910 and the lateral surfaces of the lenses 920. If a part of the buffer layer 930 grown on the top surface of the base substrate 910 has the same crystal orientation as that of parts of the buffer layer 930 grown on the lateral surfaces of the lenses 920, the parts of the buffer layer 930 can be easily merged, and thus the buffer layer 930 can be flat after the buffer layer 930 is completely grown. Therefore, the lenses 920 may be shaped in a manner such that a part of the buffer layer 930 formed on the top surface of the base substrate 910 can have the same crystal direction as that of parts of the buffer layer 930 grown on the lateral surfaces of the lenses 920. For this, the angle between the lateral and bottom surfaces of the lenses 920 may be set to greater than 30° but smaller than 57.6°.

The buffer layer 930 is formed on the base substrate 910 to cover the lenses 920 partially or entirely. The buffer layer 930 is formed to reduce lattice mismatch between the light emitting structure 940 and the base substrate 910. The buffer layer 930 may be formed of a nitride semiconductor such as aluminum nitride (AlN). The buffer layer 930 may be formed to a thickness of 100 nm or greater.

The light emitting structure 940 is formed on the buffer layer 930 for converting an electric signal into an optical signal. The light emitting structure 940 may be formed of a compound semiconductor. In the current embodiment, the light emitting structure 940 includes an n-type compound semiconductor layer 941, an active layer 942, and a p-type compound semiconductor layer 943.

The n-type compound semiconductor layer 941 may be formed on the buffer layer 930 by using a semiconductor material having a compositional formula of $In_xAl_yGa_{1-x-y}N$ ($0 \leq x \leq 1$, $0 \leq y \leq 1$, $0 \leq x+y \leq 1$). The n-type compound semiconductor layer 941 may be a GaN or GaN/AlGaN layer doped with an n-type dopant and having a thickness of several micrometers (µm). The n-type dopant may be a group IV element such as silicon (Si). The n-type compound semiconductor layer 941 forms a p-n junction together with the p-type compound semiconductor layer 943. The n-type compound semiconductor layer 941 supplies electrons to the active layer 942.

The active layer 942 is formed on the n-type compound semiconductor layer 941 to generate and emit light. The active layer 942 may be formed of a semiconductor material having a compositional formula of $In_xAl_yGa_{1-x-y}N$ ($0 \leq x \leq 1$, $0 \leq y \leq 1$, $0 \leq x+y \leq 1$). In the active layer 942, electric energy is converted into optical energy as electrons injected from the n-type compound semiconductor layer 941 recombine with holes injected from the p-type compound semiconductor layer 943. Thus, light is emitted from the active layer 942. For this, the active layer 942 may be formed into a quantum well structure in which quantum well layers and barrier layers are alternately stacked. To improve charge confinement in the quantum well layers, the active layer 942 may have a multi quantum well (MQW) structure in which a plurality of quantum well layers and a plurality of barrier layers are alternately stacked. The quantum well layers may be formed of a material having a relatively lower energy band gap such as InGaN, and the barrier layers may be formed of a material having a higher energy band gap such as GaN. The wavelength of light emitted from the active layer 942 is determined by the amount of indium (In).

The p-type compound semiconductor layer 943 may be formed on the active layer 942 by using a semiconductor material having a compositional formula of $In_xAl_yGa_{1-x-y}N$ ($0 \leq x \leq 1$, $0 \leq y \leq 1$, $0 \leq x+y \leq 1$). The p-type compound semiconductor layer 943 may be a GaN or GaN/AlGaN layer doped with a p-type dopant and having a thickness of several angstrom (Å). The p-type dopant may be a group II element such as magnesium (Mg). The p-type compound semiconductor layer 943 forms a p-n junction together with the n-type compound semiconductor layer 941. The p-type compound semiconductor layer 943 supplies holes to the active layer 942.

The transparent electrode 950 and the p-type contact electrode 960 are sequentially formed on the light emitting structure 940. The transparent electrode 950 is disposed between the light emitting structure 940 and the p-type contact electrode 960 to increase a current injection area without reducing brightness. The transparent electrode 950 may be formed of a transparent conductive oxide (TCO) such as indium-tin oxide (ITO). Since light emitted from the light emitting structure 940 can be absorbed in the transparent electrode 950, light extraction efficiency may be reduced if the transparent electrode 950 is thick. Therefore, for ohmic contact between the transparent electrode 950 and the light emitting structure 940, large current injection area, and good light extraction efficiency, the transparent electrode 950 may be formed to a thickness of 80 nm or less.

The n-type contact electrode 970 is formed on a part of the n-type compound semiconductor layer 941. The p-type contact electrode 960 and the n-type contact electrode 970 may be formed of one of titanium (Ti), chromium (Cr), aluminum (Al), palladium (Pd), vanadium (V), tungsten (W), and combinations thereof.

In the above embodiment, the light emitting structure 940 of the light emitting device 900 is formed of a material having a compositional formula of $In_xAl_yGa_{1-x-y}N$ ($0 \leq x \leq 1$, $0 \leq y \leq 1$, $0 \leq x+y \leq 1$) (GaN-based light emitting device). However, the light emitting structure 940 may be formed of another group III-V compound semiconductor material. The light emitting structure 940 may be formed of a semiconductor material having a compositional formula of $Al_xGa_yIn_{1-x-y}P$ ($0 \leq x \leq 1$, $0 \leq y \leq 1$, $0 \leq x+y \leq 1$). In another embodiment, the light emitting structure 940 may be formed of a semiconductor material having a compositional formula of $Al_xGa_{1-x}As$ ($0 \leq x \leq 1$). In addition, another stacked structure capable of generating light may be used instead of the light emitting structure 940. In any embodiment, if a plurality of lenses 920 are aimed on the base substrate 910, light extraction efficiency can be improved to 69% or higher, and a high-quality buffer layer can be formed. That is, a high-performance light emitting device can be provided.

According to the substrate of the embodiments, since a nitride semiconductor layer can be grown on the substrate although the lenses are arranged more densely, the light emitting device can have largely improved light extraction efficiency and characteristics.

Although the semiconductor substrate and the light emitting device including the semiconductor substrate have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A substrate for a light emitting device comprising the substrate, a buffer layer, and a light emitting structure, the buffer layer and the light emitting structure being sequentially stacked on the substrate, the substrate comprising a plurality of lenses disposed on a top surface thereof,
   wherein the lenses have a horn shape and are configured such that the buffer layer grows both on the top surface of the substrate and lateral surfaces of the lenses in a condition that a part of the buffer layer growing on the top surface of the substrate has the same crystal orientation as that of parts of the buffer layer growing on the lateral surfaces of the lenses.

2. The substrate of claim 1, wherein an angle between lateral and bottom surfaces of the lenses is greater than 30° but smaller than 57.6°.

3. The substrate of claim 2, wherein the lenses have a height equal to or greater than 1.6 µm and are arranged at intervals of 1 µm or smaller.

4. A light emitting device comprising:
   a substrate comprising a plurality of lenses;
   a buffer layer disposed on the substrate; and
   a light emitting structure disposed on the buffer layer,
   wherein the lenses have a horn shape and are configured such that the buffer layer grows both on a top surface of the substrate and lateral surfaces of the lenses in a condition that a part of the buffer layer growing on the top surface of the substrate has the same crystal orientation as that of parts of the buffer layer growing on the lateral surfaces of the lenses.

5. The light emitting device of claim 4, wherein an angle between lateral and bottom surfaces of the lenses is greater than 30° but smaller than 57.6°.

6. The light emitting device of claim 5, wherein the lenses have a height equal to or greater than 1.6 µm and are arranged at intervals of 1 µm or smaller.

7. The light emitting device of claim 5, wherein the buffer layer is formed of a nitride semiconductor.

8. The light emitting device of claim 7, wherein the nitride semiconductor is an MN (aluminum nitride).

9. The light emitting device of claim 5, wherein the buffer layer has a thickness of 100 nm or greater.

10. The light emitting device of claim 5, further comprising a transparent electrode and a contact electrode that are sequentially stacked on the light emitting structure.

11. The light emitting device of claim 10, wherein the transparent electrode is formed of a TCO (transparent conductive oxide).

12. The light emitting device of claim 11, wherein the TCO is ITO (indium tin oxide).

13. The light emitting device of claim 11, wherein the transparent electrode has a thickness of 80 nm or smaller.

* * * * *